(12) United States Patent
Wang et al.

(10) Patent No.: US 10,825,842 B2
(45) Date of Patent: Nov. 3, 2020

(54) DISPLAY PANEL AND MANUFACTURING METHOD THEREOF, DISPLAY DEVICE

(71) Applicants: BOE TECHNOLOGY GROUP CO., LTD., Beijing (CN); Ordos Yuansheng Optoelectronics Co., Ltd., Inner Mongolia (CN)

(72) Inventors: Zhen Wang, Beijing (CN); Jian Sun, Beijing (CN); Han Zhang, Beijing (CN)

(73) Assignees: BOE TECHNOLOGY GROUP CO., LTD., Beijing (CN); Ordos Yuansheng Optoelectronics Co., Ltd., Inner Mongolia (CN)

( * ) Notice: Subject to any disclaimer, the term of this patent is extended or adjusted under 35 U.S.C. 154(b) by 0 days.

(21) Appl. No.: 16/118,357

(22) Filed: Aug. 30, 2018

(65) Prior Publication Data
US 2019/0164996 A1    May 30, 2019

(30) Foreign Application Priority Data
Nov. 27, 2017   (CN) .......................... 2017 1 1205655

(51) Int. Cl.
*H01L 27/12* (2006.01)
*H01L 29/786* (2006.01)

(52) U.S. Cl.
CPC ........ *H01L 27/124* (2013.01); *H01L 27/1222* (2013.01); *H01L 27/1248* (2013.01); *H01L 27/1259* (2013.01); *H01L 29/78675* (2013.01); *H01L 29/78633* (2013.01)

(58) Field of Classification Search
CPC .......................... H01L 27/124; H01L 27/1248
See application file for complete search history.

(56) References Cited

U.S. PATENT DOCUMENTS

| 10,197,837 | B2* | 2/2019 | Xu .......................... G06F 3/044 |
| 2006/0001790 | A1* | 1/2006 | Chu .................. G02F 1/136286 349/44 |
| 2013/0082272 | A1* | 4/2013 | Nakanishi ......... G02F 1/136204 257/72 |
| 2014/0146257 | A1* | 5/2014 | Fujikawa .............. G02F 1/1345 349/42 |

(Continued)

FOREIGN PATENT DOCUMENTS

| CN | 104978918 A | 10/2015 |
| CN | 106094373 A | 11/2016 |
| CN | 107274837 A | 10/2017 |

OTHER PUBLICATIONS

Chinese Office Action dated Nov. 20, 2019, from application No. 201711205655.2.

*Primary Examiner* — Caridad Everhart
*Assistant Examiner* — Ankush K Singal
(74) *Attorney, Agent, or Firm* — Foley & Lardner LLP

(57) ABSTRACT

The present disclosure provides a display panel, a manufacturing method of a display panel, and a display device including the display panel. The display panel includes: an array substrate, including a display region, a non-display region around the display region, and data lines extending into the non-display region; a planarization layer, covering the data lines; and a metal wiring layer, disposed on the planarization layer in the non-display region, and including a plurality of metal wirings spaced apart from each other and corresponding to the data lines.

11 Claims, 6 Drawing Sheets

(56) References Cited

U.S. PATENT DOCUMENTS

| | | | | |
|---|---|---|---|---|
| 2015/0116295 A1* | 4/2015 | Pyon | ............... | H01L 51/5203 |
| | | | | 345/211 |
| 2018/0337364 A1* | 11/2018 | Kwon | ............. | H01L 51/5246 |
| 2018/0374955 A1* | 12/2018 | Yoshida | .......... | H01L 29/7869 |

* cited by examiner

DISPLAY PANEL AND MANUFACTURING METHOD THEREOF, DISPLAY DEVICE

CROSS-REFERENCE

The present application is based upon and claims priority to Chinese Patent Application No. 201711205655.2, filed on Nov. 27, 2017, and the entire contents thereof are incorporated herein by reference.

TECHNICAL FIELD

The present disclosure relates to the field of display technology, in particular, to a display panel, a manufacturing method of a display panel, and a display device including the display panel.

BACKGROUND

In recent years, with the development of science and technology, the display screen has gradually developed toward a thin structure with a high screen-to-body ratio and a narrow border. In order to improve the visual effect of a display screen, the four corners of the display screen are also beveled or rounded to perform a design with an abnormal shape such as C-angle, R-angle, L-shape or U-shape.

The display screen includes a display region in the middle and a border at the sides. Generally, wirings are arranged in the border. Due to the design with an abnormal shape and increasingly complicated wiring, the wiring will occupy more space, resulting in that the border at a location in an abnormal shape has a width that is 1.2 to 1.5 times that of a conventional border, which goes against the development of a narrow border display.

In view of this, there is an urgent need in the art to develop a technique capable of reducing a border at a location in an abnormal shape to increase the screen-to-body ratio.

It should be noted that the information disclosed in the foregoing background section is only for enhancement of understanding of the background of the present disclosure and therefore may include information that does not constitute the prior art that is already known to those of ordinary skill in the art.

SUMMARY

The present disclosure provides a display panel, a manufacturing method of a display panel, and a display device including the display panel.

Other features and advantages of the present disclosure will be apparent from the following detailed description, or learned in part by the practice of the present disclosure.

According to a first aspect of the present disclosure, there is provided a display panel, including: an array substrate, including a display region, a non-display region around the display region, and data lines extending into the non-display region; a planarization layer, covering the data lines; and a metal wiring layer, disposed on the planarization layer in the non-display region, and including a plurality of metal wirings spaced apart from each other and corresponding to the data lines.

In an exemplary arrangement of the present disclosure, the display panel further includes: a first insulating layer, covering the metal wiring layer; a first electrode layer, disposed on the first insulating layer and including a plurality of first electrodes corresponding to the metal wirings.

In an exemplary arrangement of the present disclosure, the first electrode layer is disposed in a same layer as that of a pixel electrode in the display region.

In an exemplary arrangement of the present disclosure, a second insulating layer is disposed between the planarization layer and the metal wiring layer.

In an exemplary arrangement of the present disclosure, the first electrode is coupled to the metal wiring through a first through-hole, and the first through-hole is disposed in the first insulating layer.

In an exemplary arrangement of the present disclosure, the first electrode is coupled to the data line through a second through-hole, and the second through-hole is disposed in the first insulating layer, the second insulating layer and the planarization layer.

According to a second aspect of the present disclosure, there is provided a manufacturing method of a display panel, including: providing an array substrate including a display region, a non-display region around the display region, and data lines extending into the non-display region; forming a planarization layer on the data lines; forming a metal wiring layer on the planarization layer, the metal wiring layer including a plurality of metal wirings spaced apart from each other and corresponding to the data lines; forming a first insulating layer on the metal wirings and a portion of the planarization layer not covered by the metal wirings; and forming a first electrode layer on the first insulating layer, the first electrode layer including a plurality of first electrodes coupled to the metal wirings and the data lines.

In an exemplary arrangement of the present disclosure, the method further includes: forming a second insulating layer between the planarization layer and the metal wiring layer.

In an exemplary arrangement of the present disclosure, the forming a first electrode layer on the first insulating layer includes: providing a mask layer on the first insulating layer; etching the first insulating layer to form a first through-hole and the first insulating layer, the second insulating layer and the planarization layer to form a second through-hole by the mask layer; filling the first through-hole and the second through-hole with a conductive material, and forming the first electrode layer on the first through-hole and the second through-hole to couple the first electrode to the metal wiring and the data line.

According to a third aspect of the present disclosure, there is provided a display device including the above display panel.

It is to be understood that both the foregoing general description and the following detailed description are exemplary and explanatory only and are not restrictive of the present disclosure.

BRIEF DESCRIPTION OF THE DRAWINGS

The accompanying drawings herein, which are incorporated in and constitute a part of this description, illustrate arrangements consistent with the present disclosure, and together with the description serve to explain the principles of the present disclosure. Obviously, the drawings in the following description are merely some arrangements of the present disclosure, and those skilled in the art can also obtain other drawings based on these drawings without any creative work. In the drawing.

DETAILED DESCRIPTION

Figure 1:
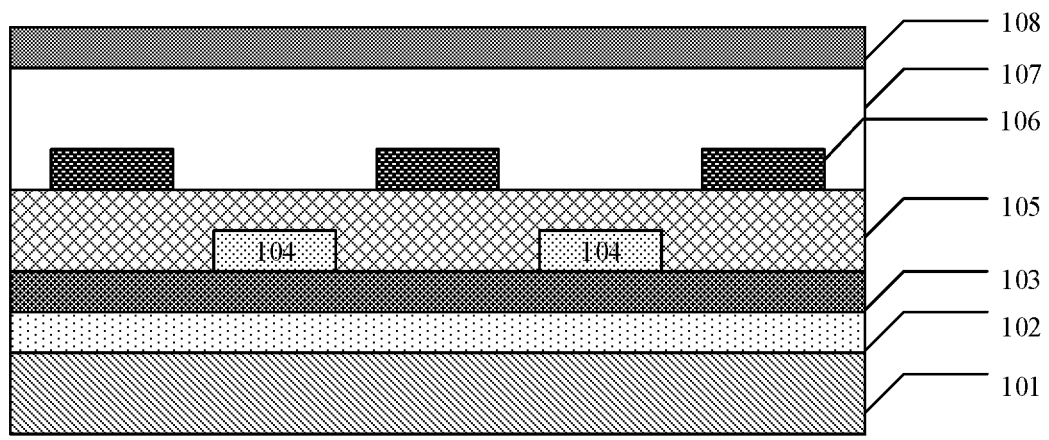
FIG. 1 is a schematic cross-sectional view showing a wiring at a location in an abnormal shape in the related art.

Exemplary arrangements will now be described more fully with reference to the accompanying drawings. However, the exemplary arrangements can be implemented in various forms and should not be construed as limited to the examples set forth herein; rather, these arrangements are provided so that this disclosure will be more complete and thorough, and will fully convey the concept of the exemplary arrangements to those skilled in the ar. The features, structures, or characteristics described may be combined in any suitable manner in one or more arrangements. In the following description, numerous specific details are provided to provide a thorough understanding of the arrangements of the present disclosure. However, those skilled in the art will recognize that the technical solutions of the present disclosure may be practiced without one or more of the specific details, or that other methods, components, devices, steps, etc. may be employed. In other instances, well-known technical solutions have not been shown or described in detail to avoid obscuring aspects of the present disclosure.

The terms "a", "an", "the", and "said" are used in the description to indicate that one or more elements/components/etc. are present, the terms "comprising", "including" and "having" should be understood in an open-ended meaning and are used to mean that there may be additional elements/components/etc. in addition to listed elements/components/etc. The terms "first" and "second" are used only as labels, not to limit the number of objects thereof.

Moreover, the drawings are merely schematic illustrations of the present disclosure and are not necessarily drawn to scale. The same reference numerals in the drawings denote the same or similar parts, and their repeated description will be omitted. Some of the blocks shown in the figures are functional entities and do not necessarily have to correspond to physically or logically independent entities.

Figure 2:
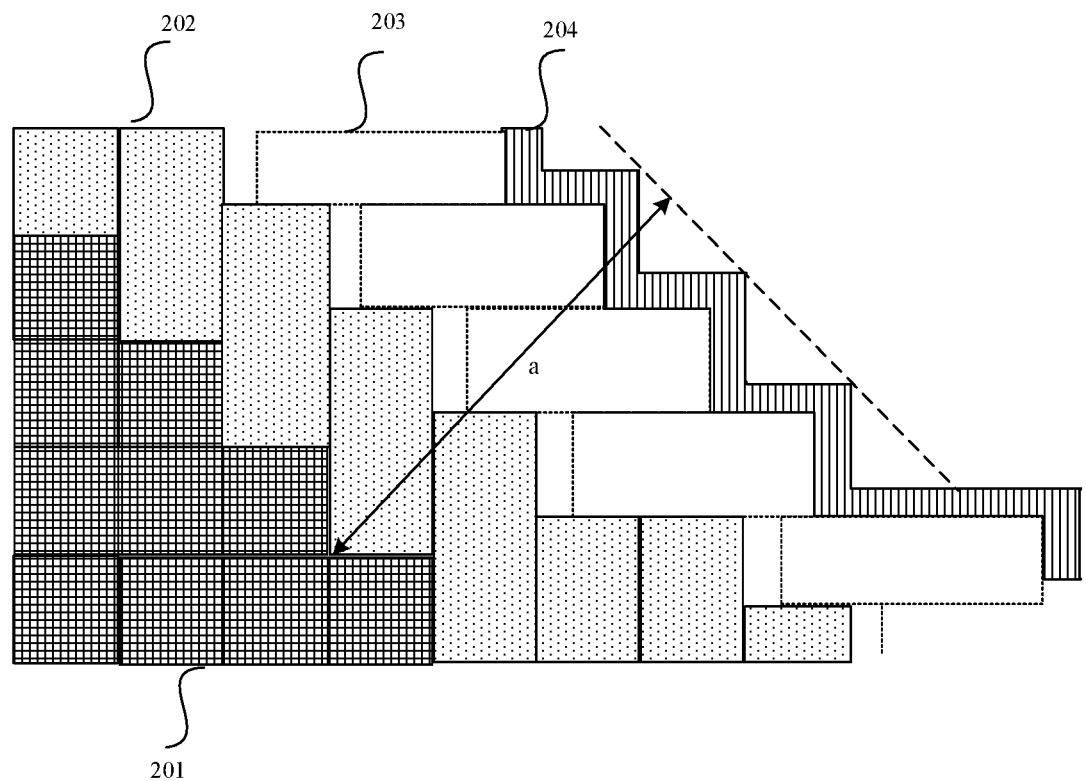
FIG. 2 is a plan view showing a wiring at a location in an abnormal shape in the related art.

FIG. 1 is a schematic cross-sectional view showing a wiring at a location in an abnormal shape in the related art. Referring to FIG. 1, the display panel may include a glass substrate 101, a buffer layer 102, a gate insulating layer 103, a gate electrode 104, an interlayer dielectric layer 105, a source/drain layer 106, a planarization layer 107, an insulating layer 108 and the like at a location in an abnormal shape. FIG. 2 is a plan view showing a wiring at a location in an abnormal shape in the related art, which shows a pixel region 201, a functional unit 202 disposed adjacent to the pixel region 201, a gate driving circuit unit 203 disposed adjacent to the functional unit 202, and a wiring 204 disposed at another side of the gate driving circuit unit 203. The functional unit 202 may include an anti-electrostatic breakdown unit, a test terminal unit, a fast discharge unit, and the like. Each functional unit 202 corresponds to a column of pixels and each gate driving circuit unit 203 corresponds to a row of pixels. As can be seen from FIG. 2, the width of the border is "a," which is a distance from the pixel region to the outermost wiring.

In the related art, the border shall cover the functional unit 202, the gate driving circuit unit 203, and the wiring 204, so that the border is relatively wide, and thus it is difficult to realize a high screen-to-body ratio and a narrow border of a display screen, thus reducing the user experience.

Figure 3:
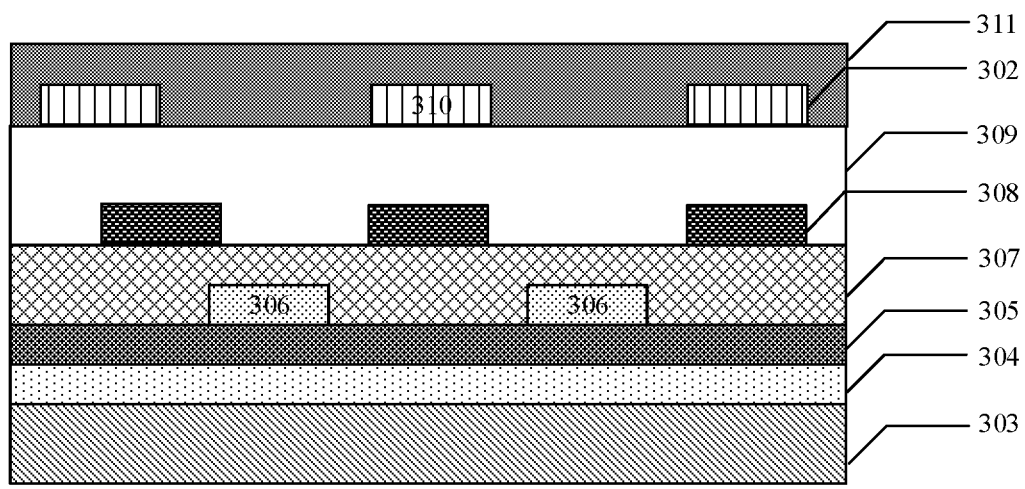
FIG. 3 is a schematic cross-sectional view showing a wiring at a location in an abnormal shape in an exemplary arrangement of the present disclosure.

Firstly, an exemplary arrangement provides a display panel. As shown in FIG. 3, the display panel includes an array substrate and a metal wiring layer 302. The array substrate includes a display region and a non-display region around the display region. The non-display region of the array substrate includes a glass substrate 303, a buffer layer 304, a gate insulating layer 305, a gate electrode 306, an interlayer dielectric layer 307, a data line layer 308, and a planarization layer 309. A metal wiring layer 302 and a first insulating layer 311 are disposed on the planarization layer 309. The metal wiring layer 302 includes a plurality of metal wirings 310 spaced apart from each other, and the metal wirings 310 are disposed over the data line layer 308 to correspond to the data line in a vertical direction. The first insulating layer 311 covers the metal wirings 310 and a portion of the planarization layer 309 not covered by the metal wirings 310. The first insulating layer 311 may include an insulating material commonly used in the art such as SiOx, SiNx, etc., which will not be described in detail herein.

In the display panel of the present disclosure, the metal wiring layer is correspondingly disposed on the gate layer and the data line layer in the non-display region, and thus no longer occupies an additional wiring space, thus reducing the border at a location in an abnormal shape. Through measurement, it is found that when disposing the metal wiring layer 302, the border at a location in an abnormal shape is reduced by 10%-30%, which realizes a high screen-to-body ratio and narrow border.

Figure 4:
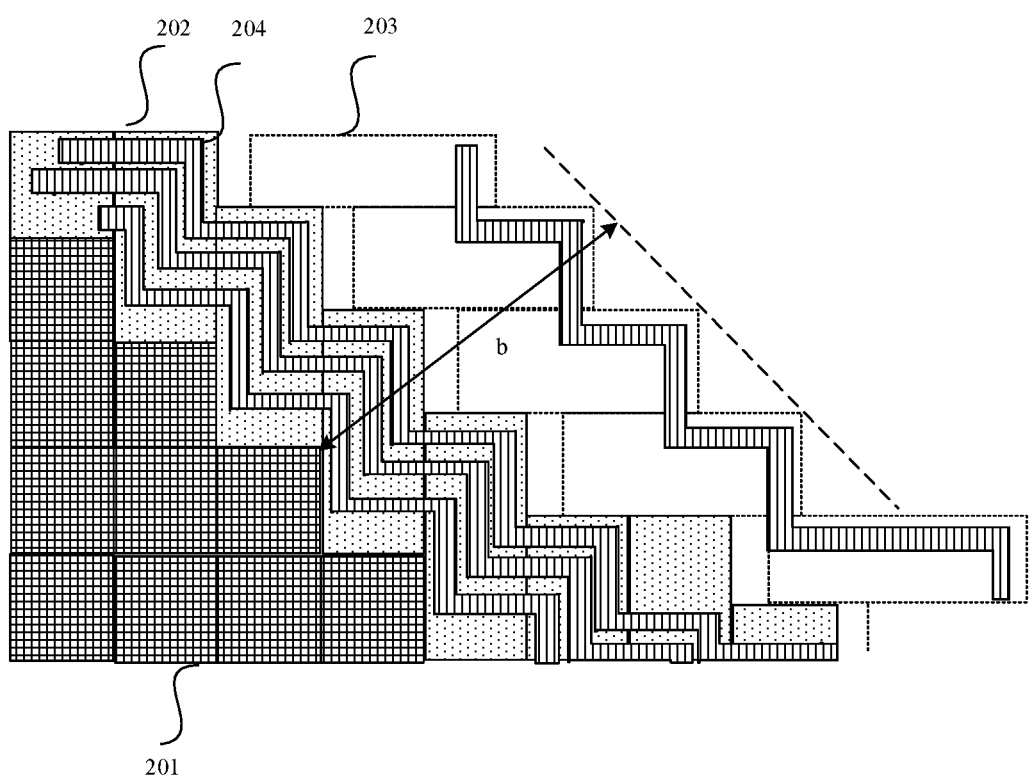
FIG. 4 is a plan view showing a wiring at a location in an abnormal shape in an exemplary arrangement of the present disclosure.

FIG. 4 shows a plan view in which the metal wiring layer 302 is disposed on the planarization layer in the non-display region. In comparison to the wiring at a location in an abnormal shape in the related art as shown in FIG. 1, in the present arrangement, the metal wirings are disposed on the functional unit 202 and the gate driving circuit unit 203, and the functional unit 202 and the gate driving circuit unit 203 may be formed into metal wirings with jumper wire which extend on the device. Therefore, the border may only cover the functional unit 202 and the gate driving circuit unit 203, and the width of the border is "b". In comparison to the related art, the wiring space in the border is greatly reduced, and thus the width of the border is reduced.

Figure 7:
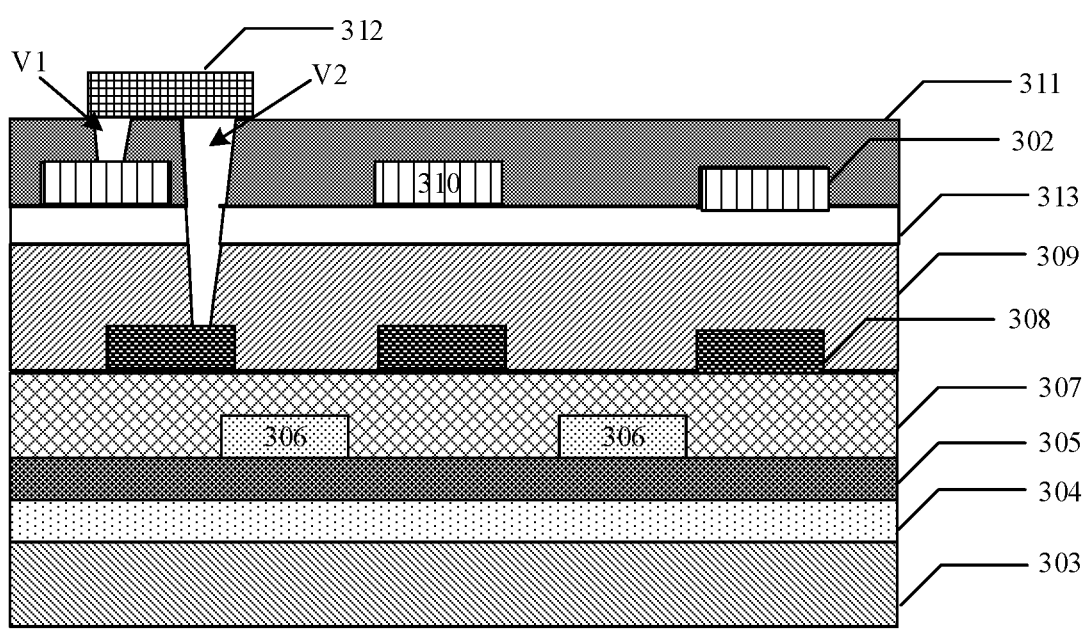
FIG. 7 is a schematic cross-sectional view showing a wiring at a location in an abnormal shape in an exemplary arrangement of the present disclosure.

As shown in FIG. 7, in an exemplary arrangement of the present disclosure, a first electrode layer 312 is disposed on the first insulating layer 311, and a first electrode of the first electrode layer 312 is disposed in a same layer as a pixel electrode in the display region. The first electrode may be also formed at the same time as that of the pixel electrode. The material of the first electrode layer 312 may be the same as or different from the material of the pixel electrode. In an exemplary arrangement, the first electrode layer 312 and the pixel electrode may be formed of the same electrode material.

As shown in FIG. 7, in an exemplary arrangement of the present disclosure, in order to prevent the planarization layer 309 from releasing gas due to heat and thus contaminating the sputtering chamber when the metal wiring layer 302 is formed by sputtering, a second insulating layer 313 may be formed between the planarization layer 309 and the metal wiring layer 302, and the second insulating layer 313 may cover the exposed planarization layer 309. The material used for the second insulating layer 313 and the material used for the first insulating layer 311 may be the same or different. The second insulating layer 313 is not essential. When the material used for the planarization layer 309 does not release gas when being heated, the second insulating layer 313 may not be provided.

Further, in the present arrangement, the first electrode layer 312 is coupled to the metal wiring layer 302 and the data line layer 308 through the first through-hole V1 and the second through-hole V2 respectively. The first through-hole V1 is disposed in the first insulating layer 311, and the second through-hole V2 is disposed in the first insulating layer 311 and the planarization layer 309 or disposed in the first insulating layer 311, the second insulating layer 313, and the planarization layer 309. A mask layer is disposed on the first insulating layer 311. The mask layer may be formed by a method commonly used in the art, for example, by spin coating, spraying, sputtering, etc., which is not specifically limited in the present disclosure. With the mask layer, the first insulating layer 311 is etched to form the first through-hole V1 in the first insulating layer 311, and at the same time, the first insulating layer 311, the second insulating layer 313 and the planarization layer 309 are etched to form the second through-hole V2.

Figure 5:
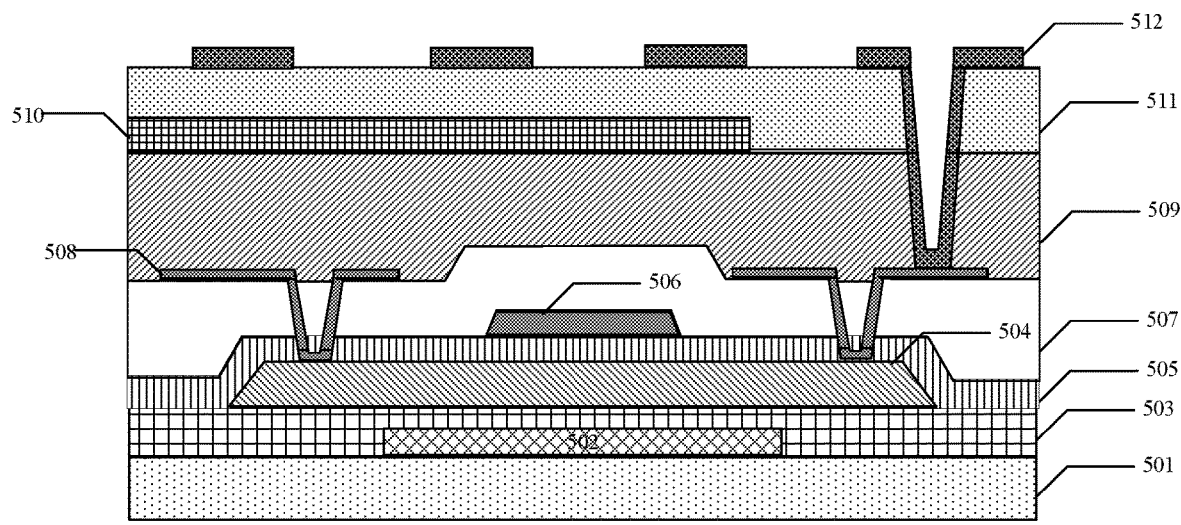
FIG. 5 is a cross-sectional view showing a display region in the related art.

FIG. 5 is a schematic structural view of a display region in the related art. As shown in FIG. 5, the display region includes a glass substrate 501, a light shielding layer 502, a buffer layer 503, a polycrystalline layer 504, and a gate insulating layer 505, a gate layer 506, an interlayer dielectric layer 507, a source/drain layer 508, a planarization layer 509, a common electrode layer 510, a first insulating layer 511, and a pixel electrode layer 512. Source and drain electrodes shown pass through the interlayer electric layer 507 and the gate insulating layer 505 to be electrically coupled to the polycrystalline layer 504. The pixel electrode layer 512 shown is electrically coupled to the source/drain layer 508 through the first insulating layer 511 and the planarization layer 509.

Figure 6:
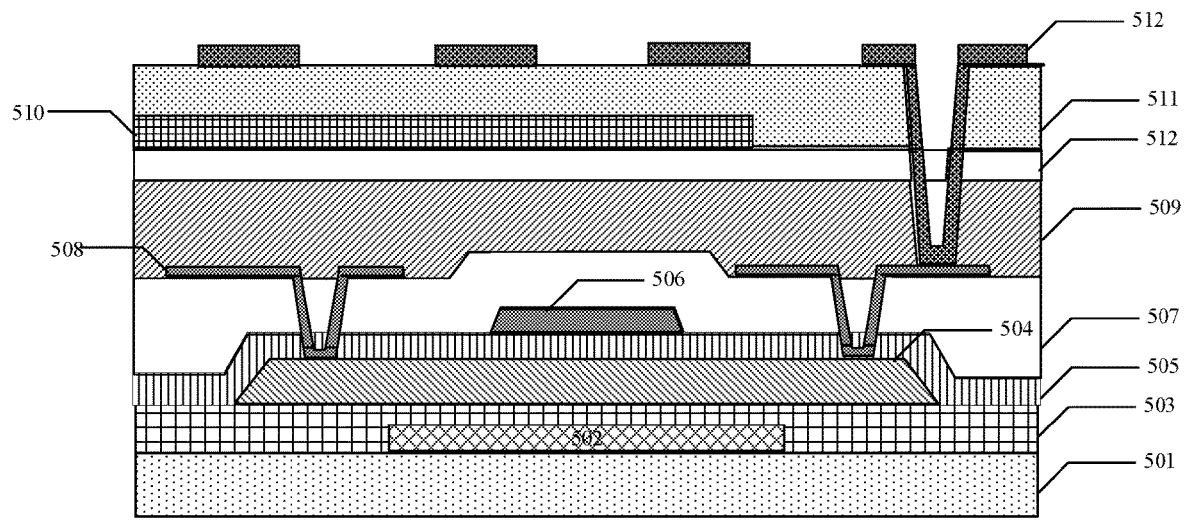
FIG. 6 is a schematic cross-sectional view showing a display region in an exemplary arrangement of the present disclosure.

In the art, the display region and the non-display region are usually formed on the same array substrate. In order to improve the manufacturing efficiency, the planarization layer 509 and the second insulating layer 512 may be simultaneously formed on the source/drain layer in the display region and the data line layer in the non-display region of the array substrate. Then, a common electrode layer 510 (shown in FIG. 6) is formed on the second insulating layer in the display region, and a metal wiring layer 302 is formed on the second insulating layer 313 in the non-display region (as shown in FIG. 7).

Figure 8:
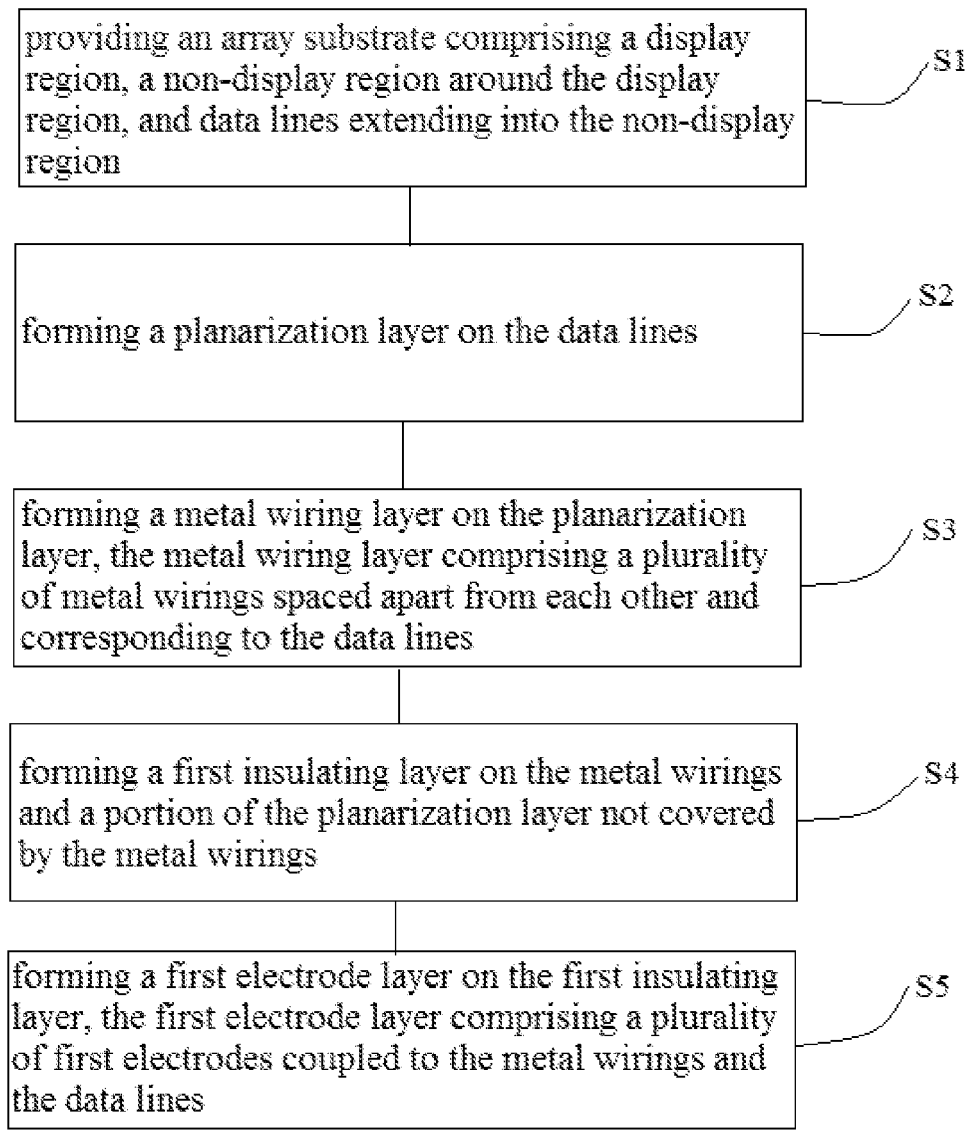
FIG. 8 is a flow chart showing a manufacturing method of a display panel in an exemplary arrangement of the present disclosure.

FIG. 8 is a flow chart showing a manufacturing method of a display panel in an exemplary arrangement of the present disclosure. The manufacturing method includes S1-S5.

In S1, an array substrate including a display region, a non-display region around the display region, and data lines extending into the non-display region is provided.

The data line is formed simultaneously with the source and drain electrodes in the display region, and may be formed of the same material as or different material from that of the source and drain electrodes. To improve manufacturing efficiency, in an exemplary arrangement, the same material is used to form the data line, source electrode and drain electrode, and the material may a metal or a metal alloy commonly used in the art, such as Au, Ag, Cu, etc., which is not specifically limited in the present disclosure.

In S2, a planarization layer is formed on the data lines.

The planarization layer is formed by forming a dielectric layer on the data lines and a portion of the interlayer dielectric layer not covered by the data lines through a process such as sputtering, coating and the like, and processing the dielectric layer through a chemical mechanical planarization process. The planarization layer may include dielectric material commonly used in the art, which is not described in detail herein.

In S3, a metal wiring layer is formed on the planarization layer. The metal wiring layer includes a plurality of metal wirings spaced apart from each other and corresponding to the data lines.

The metal wirings may be formed of metal or metal alloys commonly used in the art, which is not described herein. The metal wirings are formed above the data line layer to correspond to the data lines in the vertical direction to reduce the wiring space, thus reducing the width of the border at a location in an abnormal shape.

In S4, a first insulating layer is formed on the metal wirings and a portion of the planarization layer not covered by the metal wirings.

The first insulating layer may be formed of a material such as SiNx, SiOx and the like. Of course, other insulating materials commonly used in the art may be also used, which is not specifically limited in the present disclosure. The first insulating layer may prevent the metal wiring from being contacted with a first electrode to be formed subsequently to affect the performance of the device.

In S5, a first electrode layer is formed on the first insulating layer. The first electrode layer includes a plurality of first electrodes coupled to the metal wirings and the data lines.

The wiring space is reduced by disposing metal wirings above the data line layer, thus reducing the width of the border at a location in an abnormal shape.

In an exemplary arrangement of the present disclosure, before the S2, a second insulating layer may be formed on the planarization layer, then the metal wiring layer is formed on the second insulating layer in the non-display area, and a common electrode layer is formed on the second insulating layer in the display area. The second insulating layer is formed to cover the planarization layer, so that the planarization layer may be prevented from releasing gas due to heat and thus contaminating the sputtering chamber when the metal wiring is formed by sputtering.

Further, the above S4 may include the following: P1, providing a mask layer on the first insulating layer; P2, etching the first insulating layer to form a first through-hole and the first insulating layer, the second insulating layer and the planarization layer to form a second through-hole by the mask layer; and P3, filling the first through-hole and the second through-hole with a conductive material, and forming the first electrode layer on the first through-hole and the second through-hole to couple the first electrode to the metal wiring and the data line.

The conductive material and the material of the first electrode layer may be the same or different, and may be a metal material or a metal alloy material commonly used in the art. The conductive material and the material of the first electrode layer are not specifically limited in the present disclosure.

Filling the conductive material and forming the first electrode layer may be performed simultaneously, or may be performed differently. In an arrangement, the through-holes are filed and the first electrode layer is formed with the same conductive material at the same time. Specifically, after forming the first through-hole and the second through-hole, the mask layer is removed, and the through-holes are filed with electrode material, and the first electrode layer covering the first and second through-holes is formed on the first insulating layer.

Figure 9:
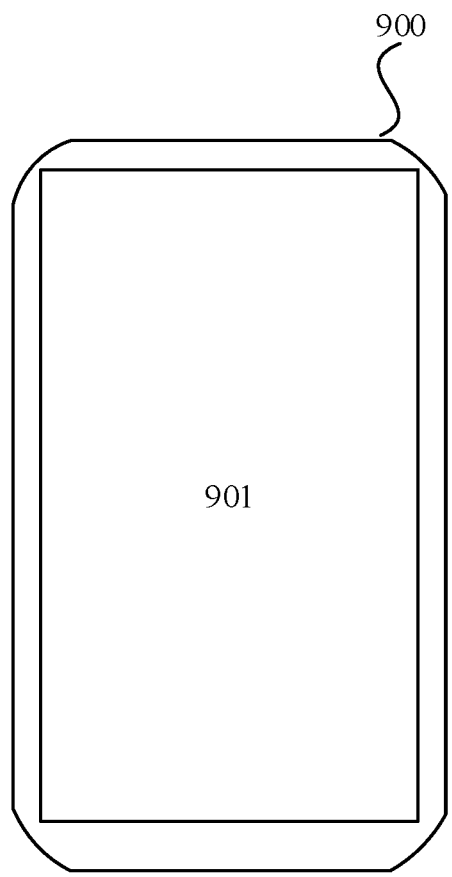
FIG. 9 is a schematic view showing a structure of a display device in an exemplary arrangement of the present disclosure.

Further, an exemplary arrangement provides a display device. As shown in FIG. 9, the display device 900 includes a display panel 901. The display panel 901 is the display panel according to the above arrangement of the present disclosure, and the display device 900 may be a product or a component having a display function, such as an electronic paper, an OLED display, a mobile phone, a tablet computer, a television, a notebook computer, a digital photo frame, a navigator, and the like.

Those skilled in the art will readily recognize other arrangements of the present disclosure upon consideration of the specification and practice of the present disclosure disclosed herein. This application is intended to cover any variations, uses, or adaptations of the present disclosure which follow the general principles of the present disclosure and include any common knowledge or conventional techniques in this technical field not disclosed by the present disclosure. The description and examples are to be considered exemplary only, with the true scope and spirit of the present disclosure being indicated by the following claims.

It should be understood that the present disclosure is not limited to the precise structure that has been described above and shown in the drawings, and various modifications and changes can be made without departing from the scope thereof. The scope of the present disclosure is limited only by the attached claims.

What is claimed is:

1. A display panel, comprising:
   an array substrate, comprising a display region, a non-display region around the display region, and data lines extending into the non-display region;
   a planarization layer, covering the data lines;
   a metal wiring layer, disposed on the planarization layer in the non-display region, and comprising a plurality of metal wirings spaced apart from each other and corresponding to the data lines;
   a first insulating layer, covering the metal wiring layer; and
   a first electrode layer, disposed on the first insulating layer and comprising a plurality of first electrodes corresponding to the metal wirings, wherein the first electrode layer and a pixel electrode in the display region are disposed in a same layer.

2. The display panel according to claim 1, wherein a second insulating layer is disposed between the planarization layer and the metal wiring layer.

3. The display panel according to claim 2, wherein one of the plurality of first electrodes is coupled to the metal wiring through a first through-hole, and the first through-hole is disposed in the first insulating layer.

4. The display panel according to claim 3, wherein one of the plurality of first electrodes is coupled to the data line through a second through-hole, and the second through-hole is disposed in the first insulating layer, the second insulating layer and the planarization layer.

5. A manufacturing method of a display panel, comprising:
   providing an array substrate comprising a display region, a non-display region around the display region, and data lines extending into the non-display region,
   forming a planarization layer on the data lines,
   forming a metal wiring layer on the planarization layer, the metal wiring layer comprising a plurality of metal wirings spaced apart from each other and corresponding to the data lines,
   forming a first insulating layer covering the metal wirings and a portion of the planarization layer not covered by the metal wirings, and
   forming a first electrode layer disposed on the first insulating layer, the first electrode layer comprising a plurality of first electrodes coupled to the metal wirings and the data lines, wherein the first electrode layer and a pixel electrode in the display region are disposed in a same layer.

6. The manufacturing method of a display panel according to claim 5, further comprising:
   forming a second insulating layer between the planarization layer and the metal wiring layer.

7. The manufacturing method of a display panel according to claim 6, wherein the forming a first electrode layer on the first insulating layer comprises:
   providing a mask layer on the first insulating layer,
   etching the first insulating layer to form a first through-hole and the first insulating layer, the second insulating layer and the planarization layer to form a second through-hole by the mask layer, and
   filling the first through-hole and the second through-hole with a conductive material, and forming the first electrode layer on the first through-hole and the second through-hole to couple the first electrode to the metal wiring and the data line.

8. A display device comprising a display panel, wherein the display panel comprises:
   an array substrate, comprising a display region, a non-display region around the display region, and data lines extending into the non-display region;
   a planarization layer, covering the data lines;
   a metal wiring layer, disposed on the planarization layer in the non-display region, and comprising a plurality of metal wirings spaced apart from each other and corresponding to the data lines;
   a first insulating layer, covering the metal wiring layer; and
   a first electrode layer, disposed on the first insulating layer and comprising a plurality of first electrodes corresponding to the metal wirings, wherein the first electrode layer and a pixel electrode in the display region are disposed in a same layer.

9. The display device according to claim 8, wherein a second insulating layer is disposed between the planarization layer and the metal wiring layer.

10. The display device according to claim 9, wherein the first electrode is coupled to the metal wiring through a first through-hole, and the first through-hole is disposed in the first insulating layer.

11. The display device according to claim 10, wherein the first electrode is coupled to the data line through a second through-hole, and the second through-hole is disposed in the first insulating layer, the second insulating layer and the planarization layer.

\* \* \* \* \*